(12) United States Patent
Seok et al.

(10) Patent No.: US 10,748,641 B2
(45) Date of Patent: Aug. 18, 2020

(54) BYTE ENABLE MEMORY BUILT-IN SELF-TEST (MBIST) ALGORITHM

(71) Applicant: QUALCOMM Incorporated, San Diego, CA (US)

(72) Inventors: Greg Seok, Round Rock, TX (US); Fahad Ahmed, San Diego, CA (US); Chulmin Jung, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 126 days.

(21) Appl. No.: 15/964,050

(22) Filed: Apr. 26, 2018

(65) Prior Publication Data

US 2019/0115091 A1   Apr. 18, 2019

Related U.S. Application Data

(60) Provisional application No. 62/572,385, filed on Oct. 13, 2017.

(51) Int. Cl.
*G11C 29/44* (2006.01)
*G11C 29/10* (2006.01)
(Continued)

(52) U.S. Cl.
CPC .............. *G11C 29/44* (2013.01); *G11C 29/10* (2013.01); *G11C 29/16* (2013.01); *G11C 29/26* (2013.01);
(Continued)

(58) Field of Classification Search
None
See application file for complete search history.

(56) References Cited

U.S. PATENT DOCUMENTS 7,325,178 B2 * 1/2008 Damodaran ........... G11C 29/16
                                                                365/201
9,098,486 B1   8/2015 Tan et al.
(Continued)

FOREIGN PATENT DOCUMENTS

GB            2367912 A     4/2002

OTHER PUBLICATIONS

International Search Report and Written Opinion—PCT/US2018/049647—ISA/EPO—dated Jan. 28, 2019.
(Continued)

*Primary Examiner* — Phung M Chung
(74) *Attorney, Agent, or Firm* — Muncy, Geissler, Olds & Lowe, P.C.

(57) ABSTRACT

A method and apparatus for memory built-in self-test (MBIST) may be configured to load a testing program from an MBIST controller, execute the testing program, and determine and write pass/fail results to a read-out register. For example, in various embodiments, the testing program may comprise one or more write operations that are configured to change data stored in a plurality of memory bitcells from a first value to a second value while a byte enable signal is asserted in order to test stability associated with a memory bitcell, create DC and AC noise due to byte enable mode stress, check at-speed byte enable mode timing, and execute a self-checking algorithm that may be designed to verify whether data is received at a data input (Din) pin. Any memory bitcells storing a value different from an expected value after performing the write operation(s) may be identified as having failed the MBIST.

28 Claims, 8 Drawing Sheets

(51) Int. Cl.
    *G11C 29/18*     (2006.01)
    *G11C 29/16*     (2006.01)
    *G11C 29/50*     (2006.01)
    *G11C 29/26*     (2006.01)
    *G11C 29/04*     (2006.01)
    *G11C 29/38*     (2006.01)

(52) U.S. Cl.
    CPC .............. *G11C 29/50* (2013.01); *G11C 29/18* (2013.01); *G11C 29/38* (2013.01); *G11C 2029/0401* (2013.01); *G11C 2029/2602* (2013.01)

(56) References Cited

U.S. PATENT DOCUMENTS

| | | |
|---|---|---|
| 9,455,028 B1 | 9/2016 | Sahu |
| 9,711,241 B2 * | 7/2017 | Anand .................. G11C 29/38 |
| 2006/0179369 A1 | 8/2006 | Bravo et al. |
| 2010/0005366 A1 | 1/2010 | Dell et al. |
| 2014/0078841 A1 | 3/2014 | Chopra |
| 2016/0293272 A1 | 10/2016 | Anand et al. |

OTHER PUBLICATIONS

Partial International Search Report—PCT/US2018/049647—ISA/EPO—dated Dec. 3, 2018.
Hamdioui S., et al., "Future Challenges in Memory Testing", Delft University of Technology, Jan. 2004, pp. 78-83.

\* cited by examiner

Temp = 25C

BYTE ENABLE MEMORY BUILT-IN SELF-TEST (MBIST) ALGORITHM

CROSS-REFERENCE TO RELATED APPLICATIONS

The present application claims the benefit of U.S. Provisional Application No. 62/572,385, entitled "BYTE ENABLE MEMORY BUILT-IN SELF-TEST (MBIST) ALGORITHM," filed Oct. 13, 2017, the contents of which are hereby expressly incorporated by reference in their entirety.

TECHNICAL FIELD

The various aspects and embodiments described herein relate to computer memory systems, and in particular, to a memory built-in self-test (MBIST) algorithm that may be used to test whether memory cells are operating correctly.

BACKGROUND

Modern system-on-chip (SoC) designs often have a substantial number of embedded memories on a single chip. These memories may be scattered around the device instead of being concentrated in one location. Typically, these memories are of different types and sizes. In addition, these memories may be further embedded inside embedded cores. This structure poses a challenge to testing all of the memories on the chips, as test access may be limited to only a few input/output (I/O) pins. Built-in self-test (BIST) logic is frequently used to test such embedded memories within SoCs, as BIST logic provides a simple and low-cost testing method with little to no performance impact. Specific testing may be required to test all of the memories on a device, which is known as memory built-in self-test (MBIST). As devices gain performance and functionality, the number of memories to support that performance and functionality grows, as does the need to test those memories. Like other BIST logic, MBIST logic may provide the capability to run one or more algorithms to verify memory functionality and to test for specific memory faults. As such, there is a general need to optimize MBIST algorithms to detect failures that may occur in a given memory device.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

According to various aspects, a method and apparatus for memory built-in self-test (MBIST) may be configured to load a testing program from an MBIST controller, execute the testing program, and determine and write pass/fail results to a read-out register. For example, in various embodiments, the testing program may comprise one or more write operations that are configured to change data stored in a plurality of memory bitcells from a first value to a second value while a byte enable signal is asserted in order to test stability associated with a memory bitcell, create DC and AC noise due to byte enable mode stress, check at-speed byte enable mode timing, and execute a self-checking algorithm that may be designed to verify whether data is received at a data input (Din) pin. Any memory bitcells storing a value different from an expected value after performing the write operation(s) may fail the MBIST.

According to various aspects, a method for performing a memory built-in self-test (MBIST) may comprise executing a testing program loaded from an MBIST controller, wherein the executed testing program comprises one or more write operations configured to change data stored in a plurality of memory bitcells from a first value to a second value while a byte enable signal is asserted, reading the data stored in the plurality of memory bitcells subsequent to performing the one or more write operations, and writing MBIST pass/fail results to a read-out register, wherein the MBIST pass/fail results indicate failure with respect to any of the plurality of memory bitcells for which the data read therefrom differs from an expected value. In various embodiments, the one or more write operations may be configured to change the data stored in the plurality of memory bitcells according to one or more rotation patterns that alternate between odd and even memory addresses. For example, in various embodiments, the one or more rotation patterns may comprise a first rotation pattern that starts with the odd memory addresses and a second rotation pattern that starts with the even memory addresses, and the one or more rotation patterns may each comprise one or more iterations in which the data stored in the plurality of memory bitcells is changed to the second value after the data stored in the plurality of memory bitcells has been initialized to the first value.

According to various aspects, an apparatus may comprise a read-out register, a memory built-in self-test (MBIST) controller configured to store a testing program comprising one or more write operations configured to change data stored in a plurality of memory bitcells from a first value to a second value while a byte enable signal is asserted, and a memory read/write controller configured to execute the testing program stored in the MBIST controller, read the data stored in the plurality of memory bitcells subsequent to performing the one or more write operations associated with the testing program, and write MBIST pass/fail results to the read-out register, wherein the MBIST pass/fail results indicate failure with respect to any of the plurality of memory bitcells for which the data read therefrom differs from an expected value.

According to various aspects, an apparatus may comprise means for executing a testing program comprising one or more write operations configured to change data stored in a plurality of memory bitcells from a first value to a second value while a byte enable signal is asserted, means for reading the data stored in the plurality of memory bitcells subsequent to performing the one or more write operations associated with the testing program, and means for writing MBIST pass/fail results to a read-out register, wherein the MBIST pass/fail results indicate failure with respect to any of the plurality of memory bitcells for which the data read therefrom differs from an expected value.

According to various aspects, a non-transitory computer-readable storage medium may have memory built-in self-test (MBIST) instructions recorded thereon, wherein the MBIST instructions may cause a testing apparatus to execute a testing program that comprises one or more write operations configured to change data stored in a plurality of memory bitcells from a first value to a second value while a byte enable signal is asserted, read the data stored in the plurality of memory bitcells subsequent to performing the one or more write operations associated with the testing program, and write MBIST pass/fail results to a read-out register, wherein the MBIST pass/fail results indicate failure with respect to any of the plurality of memory bitcells for which the data read therefrom differs from an expected value.

Other objects and advantages associated with the aspects and embodiments disclosed herein will be apparent to those skilled in the art based on the accompanying drawings and detailed description.

BRIEF DESCRIPTION OF THE DRAWINGS

A more complete appreciation of the various aspects and embodiments described herein and many attendant advantages thereof will be readily obtained as the same becomes better understood by reference to the following detailed description when considered in connection with the accompanying drawings which are presented solely for illustration and not limitation, and in which.

DETAILED DESCRIPTION

Figure 1:
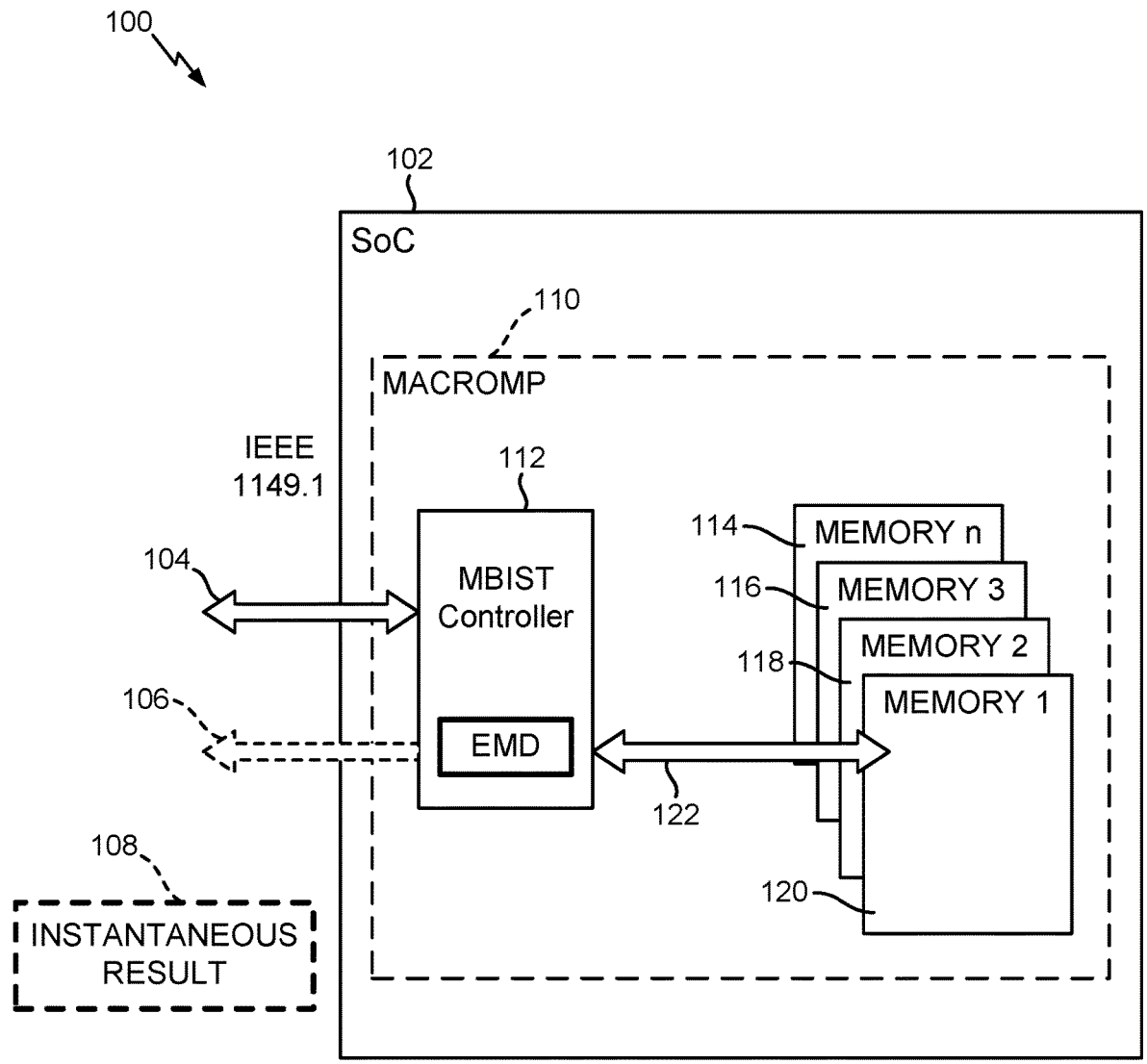
FIG. 1 illustrates an exemplary apparatus for testing memory circuits according to a memory built-in self-test (MBIST) algorithm, according to various aspects.

Various aspects and embodiments are disclosed in the following description and related drawings to show specific examples relating to exemplary aspects and embodiments. Alternate aspects and embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage, or mode of operation.

The terminology used herein describes particular embodiments only and should not be construed to limit any embodiments disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequences of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

Memory built-in self-test (MBIST) logic provides a mechanism that may allow a memory to test itself, as the name implies. Among other purposes, MBIST may be used to ensure high reliability and to lower repair cycle times. MBIST may also be used in situations where technician accessibility is limited or to reduce testing costs in the manufacturing process. For example, MBIST may reduce memory testing costs because less time is needed for memory testing and complexity of the test setup is reduced. Often, the number of input/output (I/O) signals that need to be examined are reduced.

In general, a BIST architecture may comprise a test generator that interfaces with a circuit under test (CUT) or device under test (DUT). The circuit under test receives input from the test generator and outputs a response. A test controller may be connected to the test generator and to a comparator device. The test controller may generate one or more control signals for a test pattern (e.g., a testing algorithm), wherein the one or more control signals may be provided to a test pattern generator and to the circuit under test. The test pattern generator may generate the required test patterns and the appropriate read/write signals. The comparator device may evaluate the response of the circuit under test based on a comparison to an expected output from the test signals.

For example, according to various aspects, FIG. 1 illustrates an exemplary apparatus 100 for testing memory circuits according to a memory built-in self-test (MBIST) algorithm. As shown in FIG. 1, the apparatus 100 may include a system-on-chip (SoC) 102, a communication bus 104, a test data output (TDO) 106, and instantaneous results 108. In various embodiments, the communication bus 104 may be an IEEE 1149.1 bus, or may be any suitable communication bus that provides the necessary output capability. Within the SoC 102 is a macro 110 that incorporates one or more MBIST protocols (e.g., instructions implementing one or more MBIST algorithms) within a MBIST controller 112 and various memories 114, 116, 118, 120 that may be tested according to the one or more MBIST protocols. The MBIST controller 112 may include testing protocols created by the original equipment manufacturer of the SoC 102. However, those skilled in the art will appreciate that other additional MBIST testing protocols may also be included within MBIST controller 112. While memories 114-120 are illustrated, in an actual device, the number of memories may be much greater, with as many as several hundred or more memories requiring MBIST verification. The memories 114-120 may be linked to the MBIST controller 112 through a memory interface 122, which may be any suitable interface that can pass testing instructions from the MBIST controller 112 to the memories 114-120 under test and results from the memories 114-120 under test to the MBIST controller 112.

According to various aspects, one approach to testing the memories 114-120 may be to test the various memories 114-120 in a serial manner. For example, the test may begin with a setup phase, during which one or more MBIST algorithms and clock standards are specified and loaded into the MBIST controller 112. Once the setup phase has completed, MBIST testing begins, with memories 114-120 being tested in sequence until all N memories have been tested. After the testing phase has completed, the result readout phase begins. In the result readout phase, results are read out from the various memories 114-120 sequentially until all results have been read out. The test concludes when all results are read out and written to corresponding bits in a read-out register. In another approach, the memories 114-120 may be tested and the results read out in parallel. For example, in the parallel testing and readout approach, the test similarly begins with a setup phase during which one or more testing algorithms and clock values are programmed into the MBIST controller 112. After setup is complete, testing begins, wherein the memories 114-120 may be tested and have results immediately read out before proceeding to the next memory until all N memories have been both tested and read out. At this point, testing is complete, with both testing and read out completed at the same point in time. In general, those skilled in the art will appreciate that the above descriptions are solely intended to be illustrative and that other suitable approaches may be used to test the various memories 114-120 using appropriate MBIST algorithms.

Figure 2:
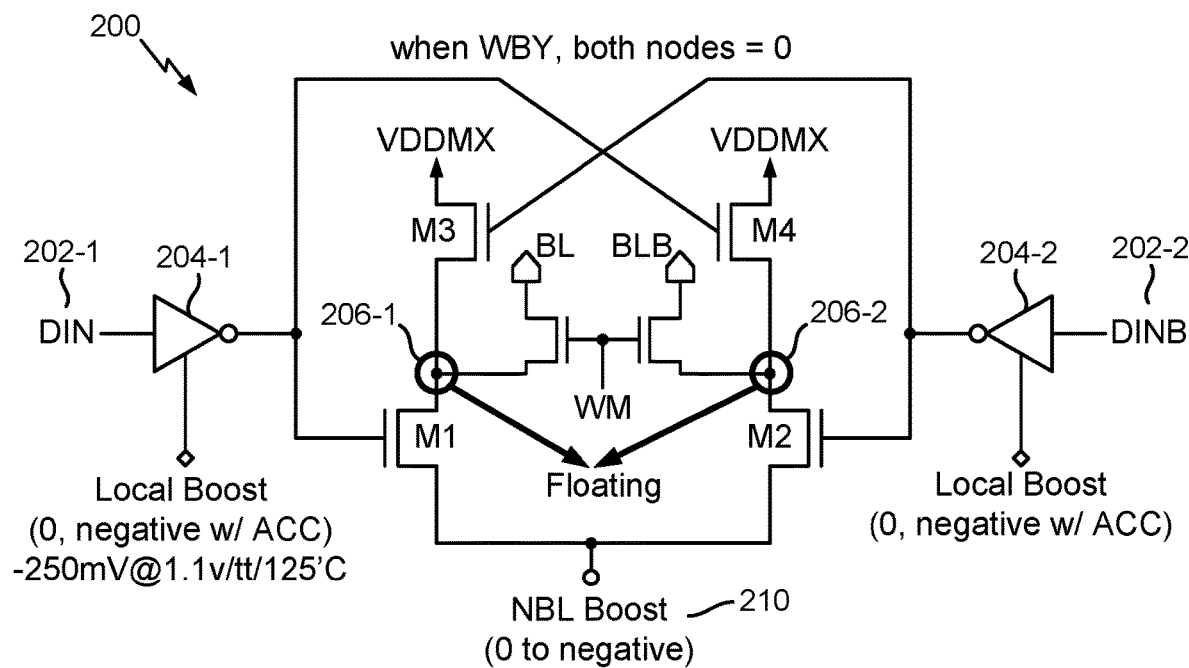
FIG. 2 illustrates an exemplary memory circuit that includes write driver and negative bitline boost circuitry, according to various aspects.

According to various aspects, FIG. 2 illustrates an exemplary memory circuit 200 that includes write driver and negative bitline boost circuitry. In various embodiments, as will be described in further detail below, the memory circuit 200 may be suitably tested using an appropriate MBIST algorithm. First, however, illustrative characteristics of the memory circuit 200 will be described as way of background.

More particularly, in various embodiments, the memory circuit 200 as shown in FIG. 2 may include complementary data input pins 202-1, 202-2 that are coupled to a pair of cross-coupled inverters 204-1, 204-2, which may be coupled to local boost circuitry that may operate according to the parameters shown in FIG. 2. Furthermore, each cross-coupled inverter 204-1, 204-2 may include a p-type metal-oxide-semiconductor (PMOS) transistor that can charge a true (Q) data node or a complementary (QB) data node. The Q data node may couple to a bitline (BL) through an n-type metal-oxide-semiconductor (NMOS) access transistor 206-1, whereas the QB data node may couple to a complementary bitline (BLB) through another NMOS access transistor 206-2. During a write operation in which the binary content of the bitcell is changed, one of the PMOS transistors will initially be on and charging its data node while the corresponding NMOS access transistor 206-1, 206-2 is attempting to discharge the same node through the corresponding bitline or complementary bitline. The NMOS access transistors 206-1, 206-2 must thus be relatively strong with regard to the corresponding PMOS transistor in the cross-coupled inverters 204-1, 204-2 so that the data node can be discharged relatively quickly despite the struggle with the PMOS transistor. To strengthen the NMOS access transistors 206-1, 206-2, one approach is to provide a negative voltage on the corresponding bitline instead of just grounding this bitline during the write operation. This negative voltage, depicted in FIG. 2 as provided by negative bitline (NBL) boost circuitry 210, may increase the strength of the NMOS access transistors 206-1, 206-2 in comparison to the PMOS transistor in the cross-coupled inverters 204-1, 204-2 so that the NMOS access transistors 206-1, 206-2 can quickly discharge the corresponding data node. In general, a coupling capacitor may be used to provide the negative voltage to the bitline. However, this can be problematic in that the negative boost to the bitline is dependent upon not only the coupling capacitance but also the bitline capacitance, which may vary depending upon the number of bit cells in a given memory configuration and process corner. Depending upon the memory configuration and process corner, the negative boost may be too small, resulting in write failure. Conversely, the negative boost may be too large, resulting in device damage.

Figure 3:
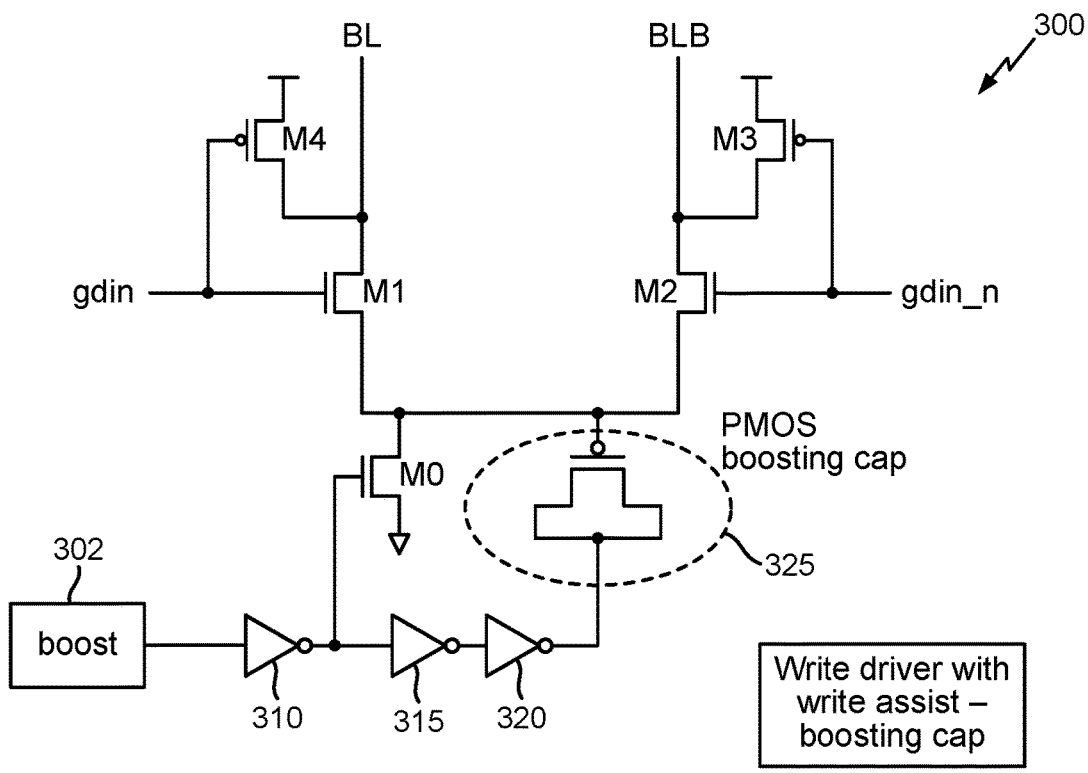
FIG. 3 illustrates an exemplary write driver in which a write assist circuit may provide a negative bitline boost, according to various aspects.

Accordingly, to address the general need for improved negative bitline assist architectures, FIG. 3 illustrates an exemplary write driver 300 in which a write assist circuit may provide a negative bitline boost (e.g., the NBL boost circuitry 210 shown in FIG. 2). In general, those skilled in the art will appreciate that the memory circuit 200 as shown in FIG. 2 and the write driver 300 as shown in FIG. 3 have various structural similarities such that various aspects described herein may apply to either or both of memory circuit 200 and/or write driver 300.

Referring to FIG. 3, the write driver 300 may include a pair of complementary write signals gdin and gdin_n that represent the binary value of a bit (q) to be written into a memory cell (not illustrated) that couples to a pair of bitlines formed by a true bitline (BL) and a complementary bitline (BLB). A negative boost signal 302 may initiate a negative bitline boost during a write operation. In this implementation, negative boost signal 302 is an active high signal such that a bitline boost operation is initiated by asserting negative boost signal 302 from its default grounded state to a power supply voltage level. An inverter 310 may invert the negative boost signal 302 to drive another pair of inverters 315, 320 and a gate of an NMOS transistor M0. During default operation outside of the bitline boost period, transistor M0 is thus turned on. The source of transistor M0 couples to ground whereas its drain acts as a ground terminal (denoted herein as PMOS boosting cap 325) for a pair of inverters (not illustrated) that are coupled to the pair of complementary write signals gdin and gdin_n in a similar manner as the pair of cross-coupled inverters 204-1, 204-2 shown in FIG. 2. In various embodiments, the inverter coupled to write signal gdin may invert the write signal gdin to drive the true bitline BL, and the inverter coupled to complementary write signal gdin_n may similarly invert the complementary write signal gdin_n to drive complementary bitline BLB. Due to the complementary nature of the write signals, one of these inverters will keep its bitline charged whereas the other will ground its bitline through PMOS boosting cap 325 while transistor M0 is conducting. Further detail relating to the structure and function of the memory circuit 200 and/or the write driver 300 shown in FIG. 3 may be provided in commonly owned U.S. Pat. No. 9,455,028, entitled "ADAPTIVE NEGATIVE BIT LINE WRITE ASSIST," the contents of which are hereby expressly incorporated by reference in their entirety.

Figure 4:
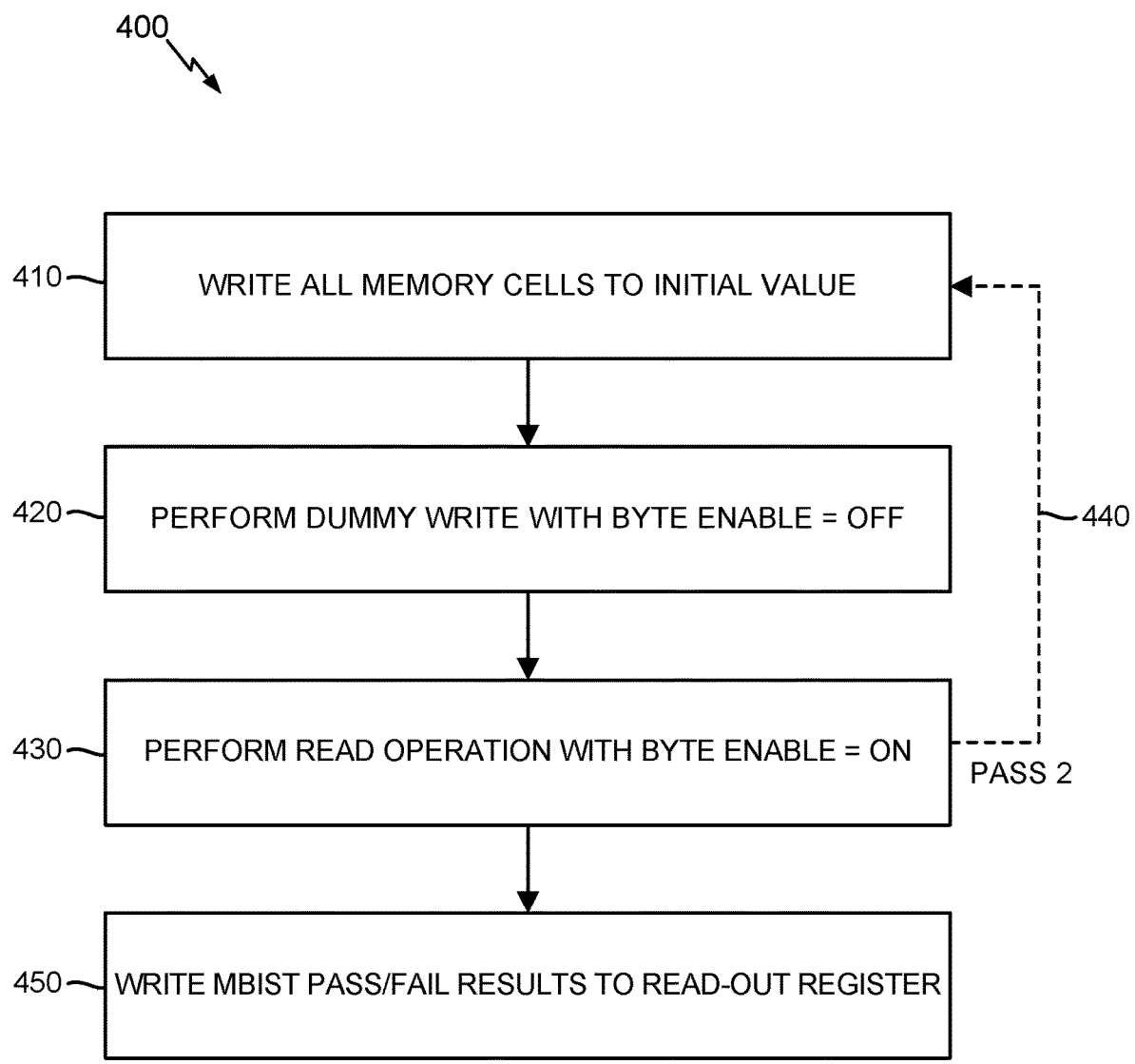
FIG. 4 illustrates an exemplary memory built-in self-test (MBIST) algorithm configured to test a memory circuit implemented in the manner shown in FIG. 2 and/or FIG. 3 for certain potential failure conditions, according to various aspects.

According to various aspects, as mentioned above, memory built-in self-test (MBIST) logic provides a mechanism that may allow a memory to test itself. As such, MBIST may be used to ensure high reliability and to lower repair cycle times, in situations where technician accessibility is limited or to reduce testing costs in the manufacturing process, to detect certain failure conditions that may arise during operation, and so on. Furthermore, as discussed above with respect to the memory circuit 200 shown in FIG. 2 and the similar write driver 300 shown in FIG. 3, a negative boost that is too small could potentially result in write failure, while a negative boost that is too large could potentially result in device damage. The latter may especially be a concern where the memory circuit 200 and/or the write driver 300 are implemented using transistors that are fabricated using FinFET technology, which tend to have enhanced electrical characteristics. For example, due to the narrow and tall fins that provide the enhanced electrical characteristics, transistors implemented using FinFET technology also tend to be mechanically weak structures, meaning that fin bending and cracking can sometimes occur in such devices, especially when there is direct current (DC) noise due to stress that may occur during a word/byte enable (WBY) mode. As such, there is a potential bitcell stability issue (e.g., fin crack) when complementary bitlines BL/BLB are driven high, especially during byte enable mode. One possible approach to clear the bitcell stability issue is to keep the complementary bitlines BL/BLB floating. Furthermore, because the bitcell stability issue can lead to failure, an MBIST algorithm may be used to detect at least such potential failures (e.g., by creating the conditions under which fin cracking and/or byte enable mode stress may arise). For example, FIG. 4 illustrates one such MBIST algorithm 400. More particularly, as will be explained in further detail herein with reference to Table 1 below, the MBIST algorithm 400 may be designed to detect the bitcell stability issue and to create DC noise due to byte enable mode stress. As shown in Table 1, the testing time for the MBIST algorithm 400 shown in FIG. 4 may require 14×N cycles, where N is $2^M$ and M is the number of memory addresses.

More particularly, the MBIST algorithm 400 shown in FIG. 4 may include a first pass in which all memory cells are written to an initial value at block 410. For example, with reference to Table 1, an 'init-0' instruction may be used to write all memory addresses to zero (0), whereby the byte enable mode (wby_n) may be on and a data input (Din) value to be written to the memory cells is zero (0). Referring again to FIG. 4, at block 420, a dummy write may then be performed with byte enable mode turned off (wby_n=0), wherein the Din value during the dummy write may be one (1). However, because the byte enable mode was off, the dummy write should not result in a change to the value of any memory cell(s), whereby the expected output (Dout) is zero (0). Referring again to FIG. 4, at block 430, a read operation may then be performed with byte enable mode turned on (wby_n=1), wherein the Din value may be changed from one (1) to zero (0) and the expected output (Dout) remains zero (0). This operation may create DC noise due to byte enable mode stress; however, because the Din value and the byte enable mode bit are changed at substantially the same time, a potential timing issue may arise in that the Din value may sometimes change after the byte enable mode bit during operation. As such, the MBIST algorithm 400 may not always create the DC noise according to the worst-case scenario, meaning that a memory circuit with certain failures could potentially pass the MBIST algorithm 400, as described below.

According to various aspects, referring again to FIG. 4, a branch 440 may be taken to return to block 410 in order to perform a second pass of the MBIST algorithm 400. In particular, as explained with reference to Table 1 below, the second pass may generally be similar to the first pass, except that the initialization operation performed at block 410 may comprise an 'init-1' instruction to write all memory cells to one (1). The dummy write performed at block 420 may then take a zero (0) value as the Din value while byte enable mode is turned off such that the expected Dout value is still one (1). In a similar manner as the first pass, a read operation is then performed at block 430 with byte enable mode turned on to create DC noise due to byte enable mode stress. After the second pass has been performed, pass/fail results may be written to a read-out register at block 450, wherein any memory cells for which the actual Dout value differs from the expected Dout value as shown in Table 1 are indicated to have failed.

TABLE 1

| Byte Enable MBIST Algorithm | | | | | | |
|---|---|---|---|---|---|---|
| Instruction | Cycles | VCD Operation Set | wby_n | Address | Din | Dout |
| init-0 | 2 | WRITE | 1 | all | 0 | 0 |
| dummy write | 3 | WRITEREADCOMPARE_ALLGWE_OFF | 0 | 0 | 1 | 0 |
|  |  |  | 0 | 1 | 1 | 0 |
|  |  |  | 0 | 2 | 1 | 0 |
|  |  |  | 0 | 3 | 1 | 0 |
|  |  |  | ... | ... | ... | ... |
| read | 2 | READ | 1 | 0 | 0 | 0 |
|  |  |  | 1 | 1 | 0 | 0 |
|  |  |  | 1 | 2 | 0 | 0 |
|  |  |  | 1 | 3 | 0 | 0 |
|  |  |  | ... | ... | ... | ... |
| init-1 | 2 | WRITE | 1 | all | 1 | 1 |
| dummy write | 3 | WRITEREADCOMPARE_ALLGWE_OFF | 0 | 0 | 0 | 1 |
|  |  |  | 0 | 1 | 0 | 1 |

TABLE 1-continued

Byte Enable MBIST Algorithm

| Instruction | Cycles | VCD Operation Set | wby_n | Address | Din | Dout |
|---|---|---|---|---|---|---|
| | | | 0 | 2 | 0 | 1 |
| | | | 0 | 3 | 0 | 1 |
| | | | ... | ... | ... | ... |
| read | 2 | READ | 1 | 0 | 0 | 1 |
| | | | 1 | 1 | 0 | 1 |
| | | | 1 | 2 | 0 | 1 |
| | | | 1 | 3 | 0 | 1 |
| | | | ... | ... | ... | ... |
| Total Cycles | 14 × N | | | | | |

Figure 5A:
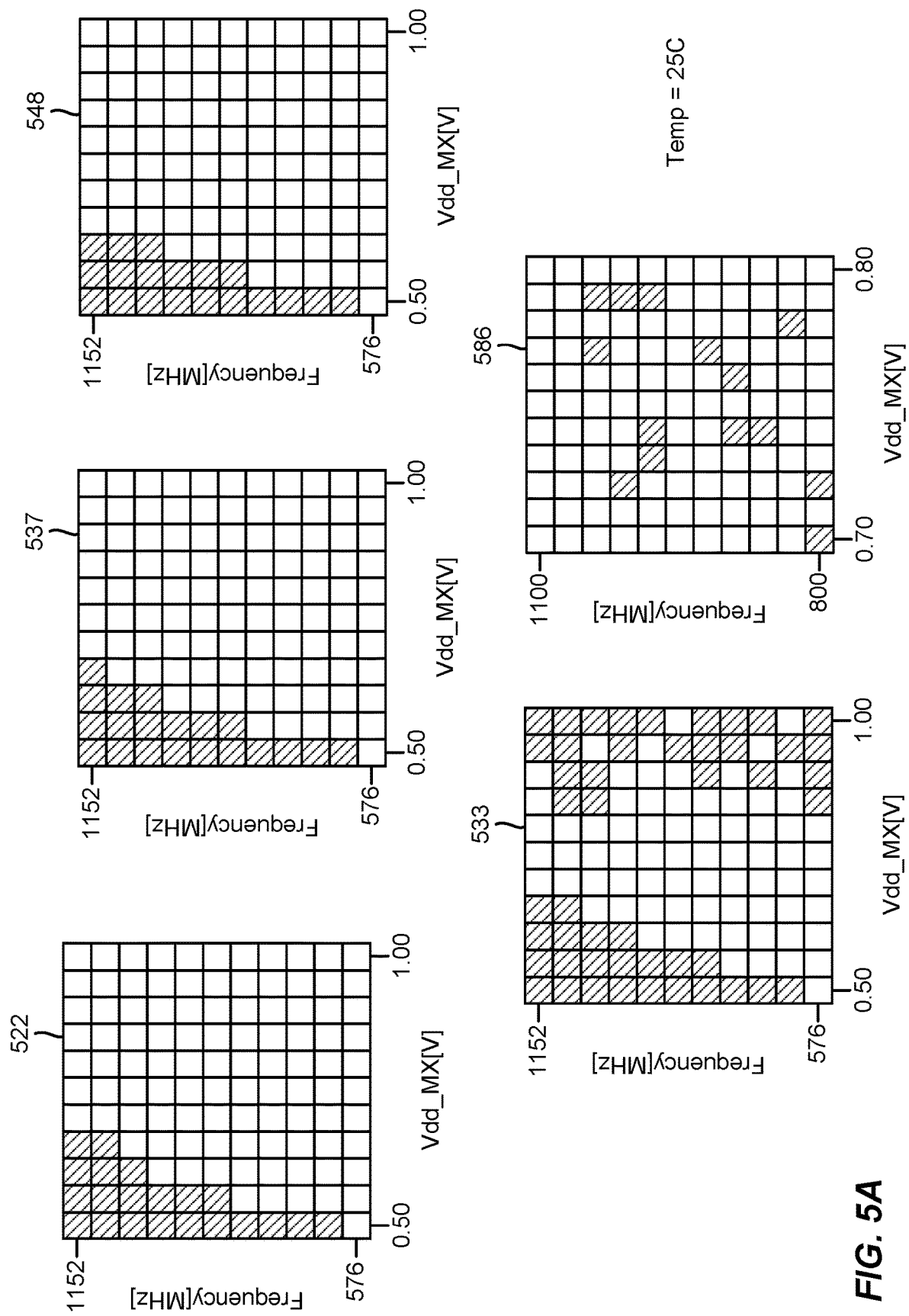
FIG. 5A-5C illustrate test results in which one or more memory circuits that passed the MBIST algorithm shown in FIG. 4 failed a functional combination test performed at automatic test equipment (ATE), according to various aspects.
Figure 5B:
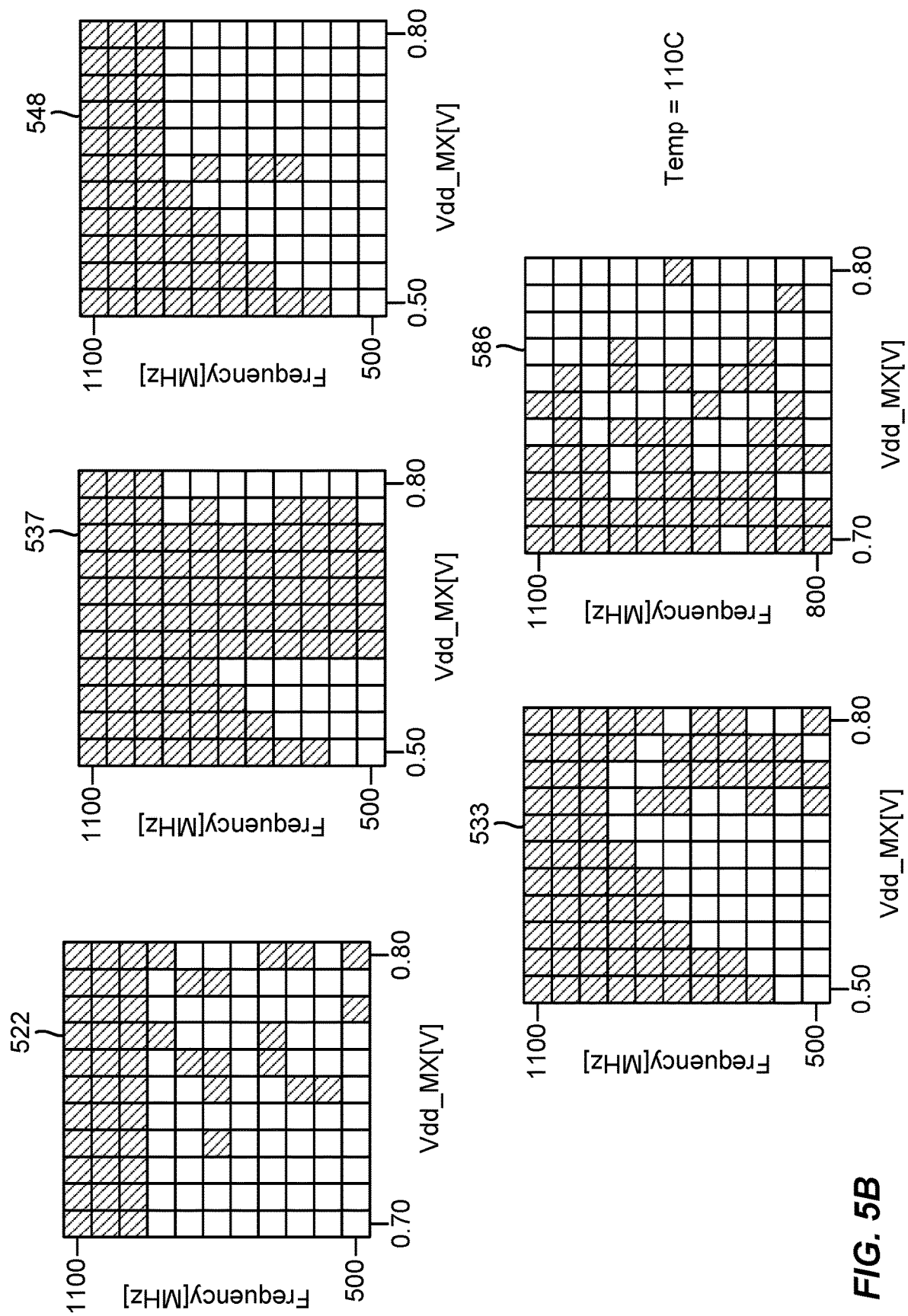
Figure 5C:
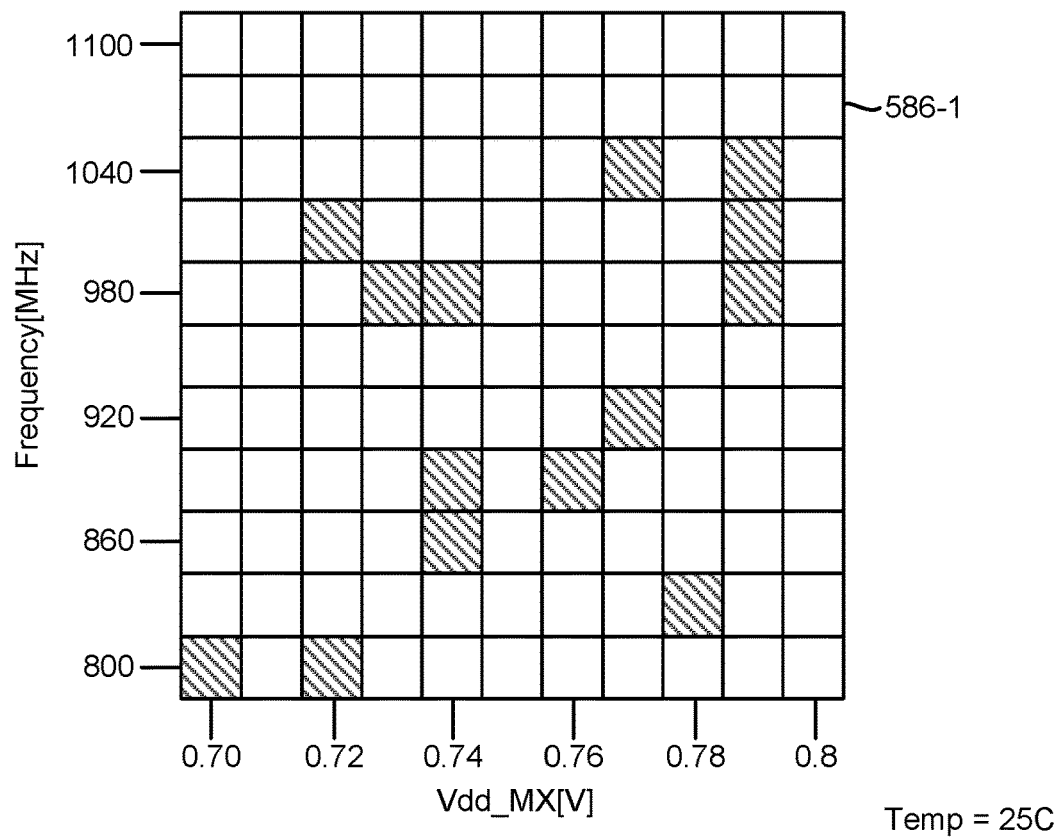
Figure 5C:
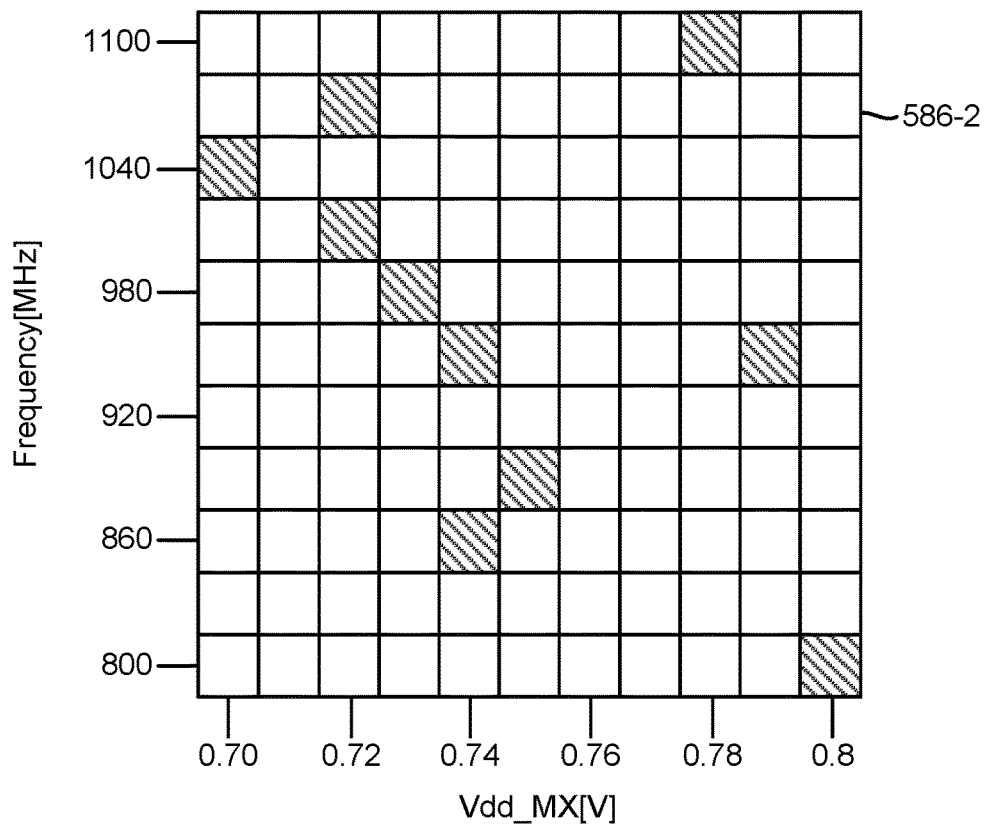

According to various aspects, as noted above, potential issues may arise when a memory device passes MBIST but later debugging performed at automatic test equipment (ATE) shows certain failures. For example, certain limitations of the MBIST algorithm 400 shown in FIG. 4 were briefly mentioned above, including timing issues whereby Din and byte enable values are changed simultaneously, which does not always create the worst case conditions. Sometimes these limitations may remain unknown until if and/or when ATE is used to conduct further functional testing. For example, FIG. 5A-5C illustrate various test results in which one or more memory circuits having the configuration(s) shown in FIG. 2 and/or FIG. 3 passed the MBIST algorithm 400 shown in FIG. 4 and were subsequently found to fail functional combination tests performed at automatic test equipment (ATE). For example, FIG. 5A illustrates various shmoo plots 522, 537, 548, 533, 586 showing functional combination test results for individual memory devices at a temperature of 25 degrees Celsius. In each of the shmoo plots 522, 537, 548, 533, 586, each square represents pass/fail results at a given voltage (Vdd_MX) and frequency, while temperature is held constant at 25 degrees Celsius, with a white square indicating that the memory passed the functional combination test at those parameters and with a shaded square indicating that the memory failed the functional combination test at those parameters. As will be apparent from the shmoo plots 522, 537, 548, 533, 586 as shown in FIG. 5A, the failure patterns exhibit holes and/or walls that reflect anomalies in the test results, wherein the failures are generally sensitive to Vdd_MX and frequency. Furthermore, in FIG. 5B, the failures in the shmoo plots 522, 537, 548, 533, 586 are more pronounced at higher temperatures, as FIG. 5B illustrates functional combination pass/fail results at 110 degrees Celsius. Notably, as indicated above, the MBIST algorithm 400 shown in FIG. 4 and in Table 1 above does not fail for any of the memory devices that correspond to the shmoo plots 522, 537, 548, 533, 586 shown in FIG. 5A-5B. Further, the pass/fail results may not be repeatable. For example, FIG. 5C illustrates a first shmoo plot 586-1 depicting pass/fail results for a first testing run for a given memory device at a constant temperature and various Vdd_MX and frequency combinations and a second shmoo plot 586-2 depicting pass/fail results for a second testing run for the same memory device at the same temperature, Vdd_MX, frequency combinations. As shown in FIG. 5C, the pass/fail results differ from the first run to the second run, whereby there may be a need to optimize the above-described MBIST algorithm 400 to detect the potential failure that can occur in the memory circuit 200 as illustrated in FIG. 2 and/or the write driver 300 illustrated in FIG. 3.

More particularly, referring to the memory circuit 200 shown in FIG. 2 as an example, the ATE failure(s) indicated in FIG. 5A-5C may be the result of certain conditions causing a bit flip in the memory circuit 200. For example, based on Dynamic Laser Stimulation (DLS) with one or more failed chips, a possible failure location may be on an SRAM write driver, specifically where NMOS access transistor 206-1 could cause the bit flip scenario during memory byte enable mode. In particular, the sensitive site may be a drain of the n-channel metal oxide semiconductor (NMOS) transistor M1, which will drive the complementary bitlines BL/BLB in the memory array. With a laser parked on that site, experimental results have shown that the NMOS transistor M1 becomes leakier and delivers a high drain voltage, which may eliminate negative boosting from the NBL boost circuitry 210. This in turn may increase the difficulty to write to the memory circuit 200 (e.g., an SRAM cell). For example, the potential bitcell disturbance during byte enable mode may be caused by the NBL boost circuitry 210 driving the NMOS access transistors 206-1, 206-2 to a lower voltage level that may then be transferred to the bitlines BL/BLB after a write multiplexer (WM) stage. When the data input pins 202-1, 202-2 are opposite to bitcell data, the byte enable mode turns off the NMOS transistors M1, M2 and charge sharing through the WM stage. Toggling the byte enable mode can then create direct current (DC) noise and alternating current (AC) noise into bitlines BL/BLB such that the data in the bitcell can flip.

Accordingly, to detect this potential failure, the MBIST algorithm 400 as shown in FIG. 4 and in Table 1 may be modified to detect the bitcell stability issue, create DC and AC noise due to byte enable mode stress, and execute a self-checking algorithm whereby a memory circuit under test may fail in the event that data is not received at the data input pin of the memory circuit under test. In contrast, the MBIST algorithm 400 shown in FIG. 4 and in Table 1 only creates DC noise due to byte enable mode stress and does not include any self-checking algorithm to find data arrival into the memory level (i.e., the memory can pass the MBIST algorithm 400 without data arrival into the data input pin). As shown in the following table, the testing time for the enhanced MBIST algorithm may require 20×N+A cycles, where N is $2^M$, M is the number of memory addresses, and A is a test step idle time that can potentially be removed.

Figure 6:
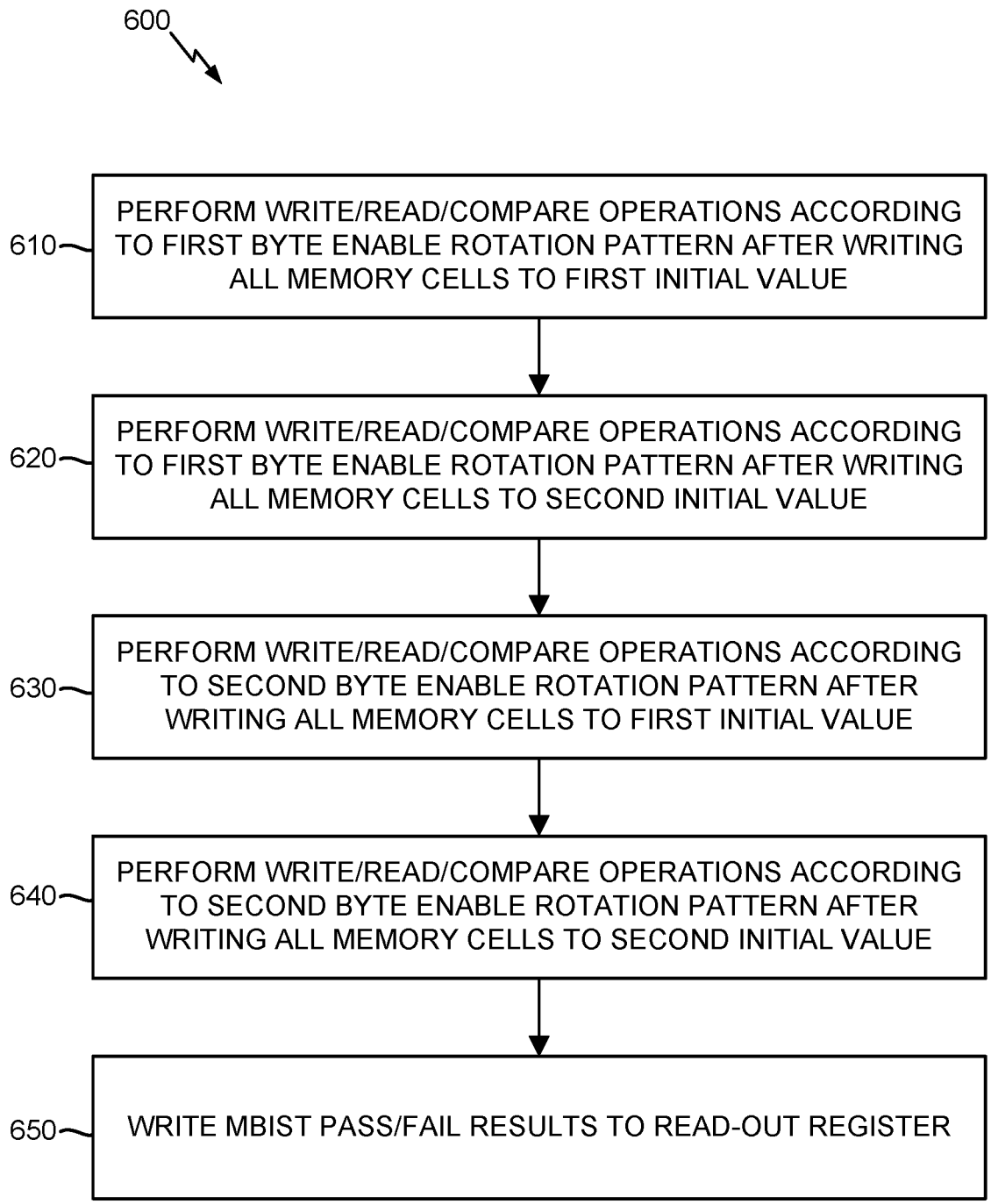
FIG. 6 illustrates an exemplary enhanced MBIST algorithm configured to detect certain failure conditions that could otherwise escape detection using the MBIST algorithm shown in FIG. 4, according to various aspects.

More particularly, according to various aspects, FIG. 6 illustrates an exemplary enhanced MBIST algorithm 600 that may detect certain failure conditions that could otherwise escape detection using the MBIST algorithm 400 shown in FIG. 4, which will be explained herein with reference to Table 2 provided below.

In various embodiments, at block 610, write-read-compare operations may be performed across all memory cells according to a first byte enable rotation pattern after all memory cells have been written to a first initial value. For example, as shown in Table 2, an 'init-0' instruction may first write all memory addresses to zero (0), whereby the byte enable mode (wby_n) may be on and a data input (Din) value to be written to the memory cells is zero (0). In the first byte enable rotation pattern, the byte enable mode may be turned on for each odd memory address (wby_n='5555') and a value of one (1) may subsequently arrive at the Din signal for each odd memory address, resulting in a corresponding expected output (Dout) of '00ff'. In the first byte enable rotation pattern, the byte enable mode may then be turned on for each even memory address (wby_n='aaaa') and a value of one (1) may subsequently arrive at the Din signal for each even memory address, resulting in a corresponding expected output (Dout) of 'ff00'. The first rotation pattern may perform the write-read-compare operations for each odd memory address and each even memory address in an alternating pattern one or more times, thereby creating AC as well as DC noise due to stress from toggling the byte enable mode. As noted above, such DC/AC noise due to toggling the byte enable mode can potentially flip the value of the data stored in the memory cell, whereby alternating between the odd and even memory addresses and attempting to change all memory addresses from zero to one may detect such a bit flip occurred if and/or when any actual Dout value read from a memory address differs from the expected Dout value as shown in Table 2. Furthermore, because the write-read-compare operations at block 610 only simulate one potential way in which the byte enable mode may be used during operation (i.e., changing data from zero to one according to an alternating odd-even pattern), additional instructions/operations may be used to simulate other potential stressful conditions that may arise in the memory circuit under test.

Accordingly, in various embodiments, at block 620, further write-read-compare operations may be performed across all memory cells according to the first byte enable rotation pattern after all memory cells have been written to a second initial value. For example, in block 620, an 'init-1' instruction may write all memory addresses to one (1), whereby the byte enable mode (wby_n) may be on and a data input (Din) value to be written to the memory cells is zero (1). In the first byte enable rotation pattern, the byte enable mode may be turned on for each odd memory address (wby_n='5555') and a value of zero (0) may subsequently arrive at the Din signal to change each odd memory address from one to zero, resulting in a corresponding expected output (Dout) of '00ff'. In the first byte enable rotation pattern, the byte enable mode may then be turned on for each even memory address (wby_n='aaaa') and a value of zero (1) may subsequently arrive at the Din signal for each even memory address, resulting in a corresponding expected output (Dout) of 'ff00'. The first rotation pattern may perform the write-read-compare operations for each odd memory address and each even memory address in an alternating pattern one or more times, thereby creating AC as well as DC noise due to stress from toggling the byte enable mode.

In various embodiments, at block 630, still further write-read-compare operations may then be performed across all memory cells according to a second byte enable rotation pattern after all memory cells have been written to the first initial value. For example, block 630, may be substantially similar to block 610, in that an 'init-0' instruction first writes all memory addresses to zero (0). However, rather than performing the subsequent write-read-compare operations in a manner that progresses through the memory addresses according to an odd-even pattern, block 630 may perform the subsequent write-read-compare operations in a manner that progresses through the memory addresses according to an even-odd pattern. In other words, the second byte enable rotation pattern performs the same write-read-compare operations as the first byte enable rotation pattern except that the order is reversed. As such, at block 640, write-read-compare operations may be performed in a similar manner as described above with respect to block 620, except that again the order is reversed such that block 640 first progresses through all even memory addresses and then through the odd memory addresses. Accordingly, at block 640, the write-read-compare operations may be performed according to the second (even-odd) byte enable rotation pattern after all memory cells are initialized/written to the second initial value (i.e., one).

TABLE 2

Enhanced Byte Enable MBIST Algorithm

| Instruction | Cycles | VCD Operation Set | wby_n | Address | Din | Dout |
|---|---|---|---|---|---|---|
| init-0 | 2 | WRITE | 1 | all | 0 | 0 |
| wby-rotation1 | 3 | WRITEREADCOMPARE_ODDGWE_ON | 5555 | 0 | 1 | 00ff |
|  |  | WRITEREADCOMPARE_EVENGWE_ON | aaaa | 1 | 1 | ff00 |
|  |  | WRITEREADCOMPARE_ODDGWE_ON | 5555 | 2 | 1 | 00ff |
|  |  | WRITEREADCOMPARE_EVENGWE_ON | aaaa | 3 | 1 | ff00 |
|  |  | . . . | . . . | . . . | . . . | . . . |
| init-1 | 2 | WRITE | 1 | all | 1 | 1 |
| wby-rotation1 | 3 | WRITEREADCOMPARE_ODDGWE_ON | 5555 | 0 | 0 | 00ff |
|  |  | WRITEREADCOMPARE_EVENGWE_ON | aaaa | 1 | 0 | ff00 |
|  |  | WRITEREADCOMPARE_ODDGWE_ON | 5555 | 2 | 0 | 00ff |
|  |  | WRITEREADCOMPARE_EVENGWE_ON | aaaa | 3 | 0 | ff00 |
|  |  | . . . | . . . | . . . | . . . | . . . |
|  |  | test step cycles |  |  |  |  |
| init-0 | 2 | WRITE | 1 | all | 0 | 0 |
| wby-rotation2 | 3 | WRITEREADCOMPARE_EVENGWE_ON | aaaa | 0 | 1 | ff00 |
|  |  | WRITEREADCOMPARE_ODDGWE_ON | 5555 | 1 | 1 | 00ff |
|  |  | WRITEREADCOMPARE_EVENGWE_ON | aaaa | 2 | 1 | ff00 |
|  |  | WRITEREADCOMPARE_ODDGWE_ON | 5555 | 3 | 1 | 00ff |
|  |  | . . . | . . . | . . . | . . . | . . . |
| init-1 | 2 | WRITE | 1 | all | 1 | 1 |

TABLE 2-continued

Enhanced Byte Enable MBIST Algorithm

| Instruction | Cycles | VCD Operation Set | wby_n | Address | Din | Dout |
|---|---|---|---|---|---|---|
| wby-rotation2 | 3 | WRITEREADCOMPARE_EVENGWE_ON | aaaa | 0 | 0 | ff00 |
| | | WRITEREADCOMPARE_ODDGWE_ON | 5555 | 1 | 0 | 00ff |
| | | WRITEREADCOMPARE_EVENGWE_ON | aaaa | 2 | 0 | ff00 |
| | | WRITEREADCOMPARE_ODDGWE_ON | 5555 | 3 | 0 | 00ff |
| | | . . . | . . . | . . . | . . . | . . . |
| Total Cycles | 20 × N | | | | | |

According to various aspects, referring again to FIG. 6, pass/fail results may be written to a read-out register at block 650 after the various instructions associated with the enhanced MBIST algorithm have completed, wherein any memory cells for which the actual Dout value are determined to differ from the expected Dout value as shown in Table 2 are indicated to have failed. Furthermore, the MBIST algorithm 600 as shown in FIG. 6 may comprise an intrinsic self-checking algorithm, wherein a failure may occur with respect to any memory cells for which data did not get into the Din signal (e.g., due to the DC and AC noise that was created by the byte enable mode stress, which may be detectable because the algorithm is carefully timed to toggle the byte enable mode prior to Din arrival, whereby failure of data to arrive at the Din signal may indicate a failure due to the previously introduced byte enable mode stress).

Figure 7:
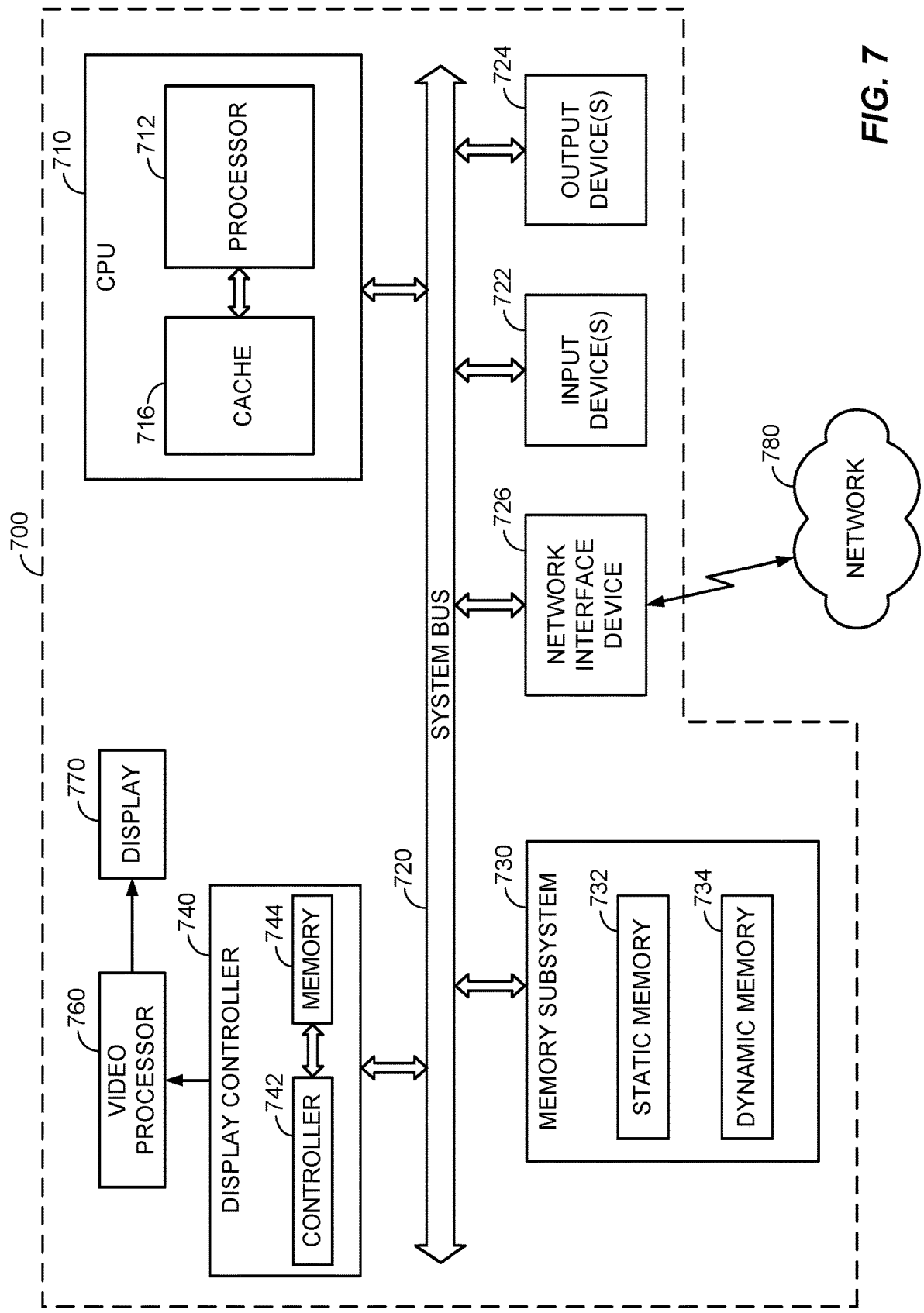
FIG. 7 illustrates an exemplary electronic device that may be configured in accordance with the various aspects and embodiments described herein.

According to various aspects, FIG. 7 illustrates an exemplary electronic device 700 having one or more memory circuits that may be configured as illustrated in FIG. 2 and FIG. 3 and appropriately tested according to the enhanced byte enable MBIST algorithm illustrated in FIG. 6 and described in further detail above.

For example, the electronic device 700 shown in FIG. 7 may be a processor-based system that includes at least one central processing unit (CPU) 710 that includes a processor 712 and a cache 716 for rapid access to temporarily stored data. According to various embodiments, the CPU 710 may be coupled to a system bus 720, which may intercouple various other devices included in the electronic device 700. As will be apparent to those skilled in the art, the CPU 710 may exchange address, control, and data information over the system bus 720 to communicate with the other devices included in the electronic device 700, which can include suitable devices. For example, as illustrated in FIG. 7, the devices included in the electronic device 700 can include a memory subsystem 730 that can include static memory 732 and/or dynamic memory 734, one or more input devices 722, one or more output devices 724, a network interface device 726, and a display controller 740. In various embodiments, the input devices 722 can include any suitable input device type, including but not limited to input keys, switches, voice processors, etc. The output devices 724 can similarly include any suitable output device type, including but not limited to audio, video, other visual indicators, etc. The network interface device 726 can be any device configured to allow exchange of data to and from a network 780, which may comprise any suitable network type, including but not limited to a wired or wireless network, private or public network, a local area network (LAN), a wide local area network (WLAN), and the Internet. The network interface device 726 can support any type of communication protocol desired. The CPU 710 can access the memory subsystem 730 over the system bus 720.

The CPU 710 can also access the display controller 740 over the system bus 720 to control information sent to a display 770. The display controller 740 can include a memory controller 742 and memory 744 to store data to be sent to the display 770 in response to communications with the CPU 710. The display controller 740 sends information to the display 770 to be displayed via a video processor 760, which processes the information to be displayed into a format suitable for the display 770. The display 770 can include any suitable display type, including but not limited to a cathode ray tube (CRT), a liquid crystal display (LCD), a plasma display, an LED display, a touchscreen display, a virtual-reality headset, and/or any other suitable display.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the various aspects and embodiments described herein.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or other such configurations).

The methods, sequences, and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of non-transitory computer-readable medium known in the art. An exemplary non-transitory computer-readable medium may be coupled to the processor such that the processor can read information from, and write information to, the non-transitory computer-readable medium. In the alternative, the non-transitory computer-readable medium may be integral to the processor. The processor and the non-transitory computer-readable medium may reside in an ASIC. The ASIC may reside in an IoT device. In the alternative, the processor and the non-transitory computer-readable medium may be discrete components in a user terminal.

In one or more exemplary aspects, the functions described herein may be implemented in hardware, software, firmware, or any combination thereof. If implemented in software, the functions may be stored on or transmitted over as one or more instructions or code on a non-transitory computer-readable medium. Computer-readable media may include storage media and/or communication media including any non-transitory medium that may facilitate transferring a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of a medium. The term disk and disc, which may be used interchangeably herein, includes CD, laser disc, optical disc, DVD, floppy disk, and Blu-ray discs, which usually reproduce data magnetically and/or optically with lasers. Combinations of the above should also be included within the scope of computer-readable media.

While the foregoing disclosure shows illustrative aspects and embodiments, those skilled in the art will appreciate that various changes and modifications could be made herein without departing from the scope of the disclosure as defined by the appended claims. Furthermore, in accordance with the various illustrative aspects and embodiments described herein, those skilled in the art will appreciate that the functions, steps, and/or actions in any methods described above and/or recited in any method claims appended hereto need not be performed in any particular order. Further still, to the extent that any elements are described above or recited in the appended claims in a singular form, those skilled in the art will appreciate that singular form(s) contemplate the plural as well unless limitation to the singular form(s) is explicitly stated.

What is claimed is:

1. A method for performing a memory built-in self-test (MBIST), comprising:

executing a testing program loaded from an MBIST controller, wherein the executed testing program comprises one or more write operations configured to change data stored in a plurality of memory bitcells from a first value to a second value while a byte enable signal is asserted;

reading the data stored in the plurality of memory bitcells subsequent to performing the one or more write operations; and writing MBIST pass/fail results to a read-out register, wherein the MBIST pass/fail results indicate failure with respect to any of the plurality of memory bitcells for which the data read therefrom differs from an expected value.

2. The method recited in claim 1, wherein the one or more write operations are configured to change the data stored in the plurality of memory bitcells according to one or more rotation patterns that alternate between odd and even memory addresses.

3. The method recited in claim 2, wherein the one or more rotation patterns comprise a first rotation pattern that starts with the odd memory addresses and a second rotation pattern that starts with the even memory addresses.

4. The method recited in claim 3, wherein the one or more rotation patterns each comprise one or more iterations in which the data stored in the plurality of memory bitcells is changed to the second value after the data stored in the plurality of memory bitcells has been initialized to the first value.

5. The method recited in claim 4, wherein the one or more iterations include a first iteration that changes the data stored in the plurality of memory bitcells to one after the data stored in the plurality of memory bitcells has been initialized to zero and a second iteration that changes the data stored in the plurality of memory bitcells to zero after the data stored in the plurality of memory bitcells has been initialized to one.

6. The method recited in claim 1, wherein the testing program is executed according to a timing in which the byte enable signal is asserted before the second value to be written to the plurality of memory bitcells arrives at a data input signal.

7. The method recited in claim 6, wherein the MBIST pass/fail results indicate failure with respect to any of the plurality of memory bitcells for which data corresponding to the second value does not arrive at the data input signal.

8. The method recited in claim 1, wherein the one or more write operations are configured to change the data stored in the plurality of memory bitcells while the byte enable signal is asserted to create direct current and alternating current noise due to a coupling between a write driver and negative bitline boost circuitry.

9. The method recited in claim 8, wherein the coupling between the write driver and the negative bitline boost circuitry creates the direct current and alternating current noise when the byte enable signal is toggled.

10. The method recited in claim 8, wherein the coupling is between the negative bitline boost circuitry and an n-type metal-oxide-semiconductor (NMOS) in the write driver arranged to drive one or more complementary bitlines in a memory array that includes the plurality of memory bitcells.

11. An apparatus, comprising:
    a read-out register;
    a memory built-in self-test (MBIST) controller configured to store a testing program comprising one or more write operations configured to change data stored in a plurality of memory bitcells from a first value to a second value while a byte enable signal is asserted; and a memory read/write controller configured to:
execute the testing program stored in the MBIST controller;
read the data stored in the plurality of memory bitcells subsequent to performing the one or more write operations associated with the testing program; and
write MBIST pass/fail results to the read-out register, wherein the MBIST pass/fail results indicate failure with respect to any of the plurality of memory bitcells for which the data read therefrom differs from an expected value.

12. The apparatus recited in claim 11, wherein the one or more write operations are configured to change the data stored in the plurality of memory bitcells according to one or more rotation patterns that alternate between odd and even memory addresses.

13. The apparatus recited in claim 12, wherein the one or more rotation patterns comprise a first rotation pattern that starts with the odd memory addresses and a second rotation pattern that starts with the even memory addresses.

14. The apparatus recited in claim 13, wherein the one or more rotation patterns each comprise one or more iterations in which the data stored in the plurality of memory bitcells is changed to the second value after the data stored in the plurality of memory bitcells has been initialized to the first value.

15. The apparatus recited in claim 14, wherein the one or more iterations include a first iteration that changes the data stored in the plurality of memory bitcells to one after the data stored in the plurality of memory bitcells has been initialized to zero and a second iteration that changes the data stored in the plurality of memory bitcells to zero after the data stored in the plurality of memory bitcells has been initialized to one.

16. The apparatus recited in claim 11, wherein the testing program is executed according to a timing in which the byte enable signal is asserted before the second value to be written to the plurality of memory bitcells arrives at a data input signal.

17. An apparatus, comprising:
means for executing a testing program comprising one or more write operations configured to change data stored in a plurality of memory bitcells from a first value to a second value while a byte enable signal is asserted;
means for reading the data stored in the plurality of memory bitcells subsequent to performing the one or more write operations associated with the testing program; and
means for writing MBIST pass/fail results to a read-out register, wherein the MBIST pass/fail results indicate failure with respect to any of the plurality of memory bitcells for which the data read therefrom differs from an expected value.

18. The apparatus recited in claim 17, wherein the one or more write operations are configured to change the data stored in the plurality of memory bitcells according to one or more rotation patterns that alternate between odd and even memory addresses.

19. The apparatus recited in claim 18, wherein the one or more rotation patterns comprise a first rotation pattern that starts with the odd memory addresses and a second rotation pattern that starts with the even memory addresses.

20. The apparatus recited in claim 19, wherein the one or more rotation patterns each comprise one or more iterations in which the data stored in the plurality of memory bitcells is changed to the second value after the data stored in the plurality of memory bitcells has been initialized to the first value.

21. The apparatus recited in claim 20, wherein the one or more iterations include a first iteration that changes the data stored in the plurality of memory bitcells to one after the data stored in the plurality of memory bitcells has been initialized to zero and a second iteration that changes the data stored in the plurality of memory bitcells to zero after the data stored in the plurality of memory bitcells has been initialized to one.

22. The apparatus recited in claim 17, wherein the testing program is executed according to a timing in which the byte enable signal is asserted before the second value to be written to the plurality of memory bitcells arrives at a data input signal.

23. A non-transitory computer-readable storage medium having memory built-in self-test (MBIST) instructions recorded thereon, the MBIST instructions configured to cause a testing apparatus to:
execute a testing program, wherein the executed testing program comprises one or more write operations configured to change data stored in a plurality of memory bitcells from a first value to a second value while a byte enable signal is asserted;
read the data stored in the plurality of memory bitcells subsequent to performing the one or more write operations associated with the testing program; and
write MBIST pass/fail results to a read-out register, wherein the MBIST pass/fail results indicate failure with respect to any of the plurality of memory bitcells for which the data read therefrom differs from an expected value.

24. The non-transitory computer-readable storage medium recited in claim 23, wherein the one or more write operations are configured to change the data stored in the plurality of memory bitcells according to one or more rotation patterns that alternate between odd and even memory addresses.

25. The non-transitory computer-readable storage medium recited in claim 24, wherein the one or more rotation patterns comprise a first rotation pattern that starts with the odd memory addresses and a second rotation pattern that starts with the even memory addresses.

26. The non-transitory computer-readable storage medium recited in claim 25, wherein the one or more rotation patterns each comprise one or more iterations in which the data stored in the plurality of memory bitcells is changed to the second value after the data stored in the plurality of memory bitcells has been initialized to the first value.

27. The non-transitory computer-readable storage medium recited in claim 26, wherein the one or more iterations include a first iteration that changes the data stored in the plurality of memory bitcells to one after the data stored in the plurality of memory bitcells has been initialized to zero and a second iteration that changes the data stored in the plurality of memory bitcells to zero after the data stored in the plurality of memory bitcells has been initialized to one.

28. The non-transitory computer-readable storage medium recited in claim 23, wherein the testing program is executed according to a timing in which the byte enable signal is asserted before the second value to be written to the plurality of memory bitcells arrives at a data input signal.

* * * * *